(12) United States Patent
Lybrand et al.

(10) Patent No.: US 10,734,742 B2
(45) Date of Patent: Aug. 4, 2020

(54) BOARD-TO-BOARD CONTACT BRIDGE SYSTEM

(71) Applicant: AVX Corporation, Fountain Inn, SC (US)

(72) Inventors: Brent Lybrand, Fountain Inn, SC (US); Norman Huntley, Fountain Inn, SC (US); Peter Bishop, Fountain Inn, SC (US)

(73) Assignee: AVX CORPORATION, Fountain Inn, SC (US)

( * ) Notice: Subject to any disclaimer, the term of this patent is extended or adjusted under 35 U.S.C. 154(b) by 0 days.

(21) Appl. No.: 16/008,663

(22) Filed: Jun. 14, 2018

(65) Prior Publication Data

US 2019/0027847 A1 Jan. 24, 2019

Related U.S. Application Data

(60) Provisional application No. 62/533,951, filed on Jul. 18, 2017.

(51) Int. Cl.
*H01R 29/00* (2006.01)
*H01R 12/71* (2011.01)
*H01R 12/73* (2011.01)
*H05K 3/36* (2006.01)
*H05K 1/14* (2006.01)
*H01R 12/70* (2011.01)
*H01R 12/75* (2011.01)

(52) U.S. Cl.
CPC ......... *H01R 12/718* (2013.01); *H01R 12/732* (2013.01); *H05K 3/368* (2013.01); *H01R 12/7088* (2013.01); *H01R 12/75* (2013.01); *H05K 1/142* (2013.01); *H05K 2201/1031* (2013.01); *H05K 2201/10356* (2013.01)

(58) Field of Classification Search
CPC .. H01R 23/7068; H01R 9/096; H01R 23/722; H01R 12/57; H01R 2103/00; H01R 23/7073; H01R 13/658; Y02E 60/12
USPC ............ 439/60, 65, 66, 83, 188, 637, 541.5, 439/607.55, 74, 500
See application file for complete search history.

(56) References Cited

U.S. PATENT DOCUMENTS 4,326,765 A * 4/1982 Brancaleone ........ H05K 7/1092
439/225
4,686,607 A * 8/1987 Johnson ............... H01R 12/716
361/761

(Continued)

FOREIGN PATENT DOCUMENTS

KR 1020090004106 A 1/2009

OTHER PUBLICATIONS

International Search Report and Written Opinion in PCT/IB2018/054066 dated Oct. 5, 2018 (13 pages).

*Primary Examiner* — Thanh Tam T Le
(74) *Attorney, Agent, or Firm* — Foley & Lardner LLP

(57) ABSTRACT

This disclosure provides for an apparatus for connecting a first printed circuit board to a second printed circuit board. More specifically, an apparatus that includes a first receptacle assembly, a second receptacle assembly, and a contact bridge is disclosed. In an embodiment, the contact bridge conductively connects with the first receptacle assembly and the second receptacle assembly. In an embodiment, the contact bridge is disposed between sets of contact beams of the first and second receptacle assemblies.

20 Claims, 6 Drawing Sheets

(56) References Cited

U.S. PATENT DOCUMENTS

| | | | | |
|---|---|---|---|---|
| 4,998,888 A * | 3/1991 | Link | G11C 5/141 | 257/E23.058 |
| 5,052,936 A * | 10/1991 | Biechler | H01R 12/725 | 439/260 |
| 5,108,299 A * | 4/1992 | Cronin | H01L 23/60 | 261/220 |
| 5,137,462 A * | 8/1992 | Casey | H01R 31/00 | 439/74 |
| 5,593,311 A * | 1/1997 | Lybrand | H01R 13/6586 | 439/188 |
| 6,341,966 B1 * | 1/2002 | Takada | H01R 12/52 | 439/108 |
| 6,406,332 B1 * | 6/2002 | Buican | H01R 12/721 | 439/631 |
| 6,695,622 B2 * | 2/2004 | Korsunsky | H01R 31/06 | 439/631 |
| 6,780,054 B2 * | 8/2004 | Yip | H01R 12/592 | 439/101 |
| 7,044,748 B2 * | 5/2006 | Korsunsky | H05K 1/14 | 439/631 |
| 7,445,467 B1 * | 11/2008 | Matsuo | H01R 13/514 | 439/637 |
| 7,798,819 B2 * | 9/2010 | Kudo | H01R 13/743 | 439/567 |
| 7,959,445 B1 * | 6/2011 | Daily | H01R 12/716 | 439/65 |
| 8,092,233 B1 * | 1/2012 | Lee | H01R 13/112 | 439/631 |
| 8,118,611 B2 * | 2/2012 | Jeon | H01R 12/523 | 439/511 |
| 8,247,107 B2 * | 8/2012 | Park | H01M 2/1044 | 361/752 |
| 8,734,167 B2 * | 5/2014 | Aimoto | H01R 13/187 | 439/74 |
| 9,624,309 B2 * | 4/2017 | Liu | A61K 47/6807 | |
| 2007/0275587 A1 | 11/2007 | Chang et al. | | |
| 2010/0203745 A1 | 8/2010 | Bishop | | |
| 2015/0349446 A1 | 12/2015 | Zantout | | |
| 2017/0093059 A1 | 3/2017 | Chen | | |

* cited by examiner

US 10,734,742 B2

BOARD-TO-BOARD CONTACT BRIDGE SYSTEM

CROSS-REFERENCE TO RELATED APPLICATIONS

This application claims priority to U.S. Provisional Patent App. No. 62/533,951, filed Jul. 18, 2017, the entire disclosure of which is incorporated herein by reference in its entirety, for any and all purposes.

FIELD

The present application relates generally to the field of electrical connectors, and more particularly to a type of connector used to connect two circuit boards or other electrical components.

BACKGROUND

The following description is provided to assist the understanding of the reader. None of the information provided or references cited are admitted to be prior art.

Various types of connectors are used for forming connections between printed circuit boards. These connectors suffer from various deficiencies. For example, some connectors utilize a plug-socket arrangement where a plug is provided on a first printed circuit board and a socket is provided on the second printed circuit board. To connect the printed circuit boards, the plug is inserted into the socket. Such connectors are costly in terms of the space on the printed circuit boards that they occupy. Thus, in applications where saving space is necessary or desired, other types of connectors (e.g., single way connectors) are used. However, such single way connectors are oftentimes difficult to install because they lack sufficient surface area for pick-and-place machines to be used. Additionally, such connectors are limited in their ability to introduce power from external sources into the printed circuit boards. Thus, a connector that is space-efficient, easy to install, and allows for external power introduction is needed.

SUMMARY OF THE INVENTION

The systems, methods and devices of this disclosure each have several innovative aspects, no single one of which is solely responsible for the desirable attributes disclosed herein.

In an embodiment, a system includes a connector that connects a first printed circuit board having a first electrical pad to a second printed circuit board having a second electrical pad. The connector includes a first receptacle assembly, a second receptacle assembly, and a contact bridge. The first receptacle assembly is connected to the first electrical pad. The first receptacle assembly includes a first surface and a second surface. The first surface is displaced from the second surface so as to form a first space between the first surface and the second surface. The first receptacle assembly further includes at least one contact beam attached to either the first surface or the second surface and extending toward the first space. The at least one contact beam has an electrically-conductive connection with the first electrical pad. The second receptacle assembly is connected to the second electrical pad. The second receptacle assembly includes a first surface and a second surface. The first surface is displaced from the second surface so as to form a second space between the first surface and the second surface. The second receptacle assembly further includes at least one contact beam attached to either the first surface or the second surface and extends towards the second space. The at least one contact beam has an electrically-conductive connection with the second electrical pad. In an embodiment, the second surfaces of the first and second receptacle assemblies are displaced from the first surfaces of the first and second receptacle assemblies in a direction that is substantially perpendicular to the first and second printed circuit boards. In an embodiment, the first printed circuit board is displaced from the second circuit board so as to create a gap between the first receptacle assembly and the second receptacle assembly. The contact bridge includes a central portion, a first receptacle engagement portion extending from a first side of the central portion, and a second receptacle engagement portion extending from a second side of the central portion. The first receptacle assembly portion is engaged with the at least one contact beam of the first receptacle assembly. The second receptacle engagement portion is engaged with the at least one contact beam of the second receptacle assembly.

The central portion of the contact bridge further includes a tab. The tab extends from a third side of the central portion. The tab is positioned within the gap between the first and second receptacle engagement portions to prevent movement of the contact bridge along a first axis of the first and second printed circuit boards. In an embodiment, the central portion also includes a loop disposed in the gap between the first and second receptacle assemblies so as to prevent movement of the contact bridge along the first axis. In an alternative embodiment, rather than the loop, the central portion of the contact bridge includes a bend, a planar portion extending from the bend, and an arching portion extending from the planar portion. The arching portion substantially encloses a volume in a circumferential manner. In some embodiments, a wire is disposed in the volume that is substantially enclosed by the arching portion.

Moreover, a surface of the first receptacle engagement portion of the contact bridge includes a first discontinuity and a surface of the second receptacle engagement portion of the contact bridge includes a second discontinuity. The first and second discontinuities are disposed proximate to at least a portion of the contact beams of the first and second receptacle assemblies so as to secure the connection between the receptacle assembly portions and the contact bridge. In an embodiment, the first and second discontinuities comprise retention bumps on the surfaces of the first and second receptacle engagement portions of the contact bridge.

In some embodiments, the first and second receptacle assemblies each include a first set of contact beams extending from the first surfaces and a second set of contact beams extending from the second surfaces. In such embodiments, the first and second receptacle engagement portions of the contact bridge are disposed between the first and second sets of contact beams of the first and second receptacle assemblies. In an embodiment, each of the contact beams in the first sets of contact beams are of a first dimension in a direction that is substantially parallel to the first axis. Further, each of the contact beams in the second sets of contact beams are of a second dimension in the direction that is substantially parallel to the first axis. In an embodiment, the second dimension is larger than the first dimension. In an embodiment, each of the contact beams of the first sets of conductive contact beams is of a lesser length than each of the contact beams of the second sets of contact beams such that the first and second receptacle engagement portions of the contact bridge are tilted with respect to the first and second printed circuit boards.

A receptacle assembly includes a body, a first set of conductive contact beams, and a second set of conductive contact beams. The body includes a first portion and a second portion. The first portion has a first surface and the second portion has a second surface. The first surface is displaced from the second surface in a first direction so as to create a space between the first and second surfaces. The first set of conductive contact beams includes at least one conductive contact beam that is connected to and extending from the first surface into the space between the first and second surfaces of the body. The second set of conductive contact beams includes at least one conductive contact beam that is connected to and extending from the second surface of the body into the space between the first and second surfaces of the body. In an embodiment, the first set of conductive contact beams includes three conductive contact beams and the second set of conductive contact beams includes two conductive contact beams. In an embodiment, the second portion of the body includes the second surface and a third surface. The second portion includes at least one opening extending from the at least one conductive contact beam of the second set of conductive contact beams to the third surface, the at least one opening comprising a vacuum pick-up nozzle for placement on a printed circuit board.

In an embodiment, the body is attached to a printed circuit board extending along or tangential to both a first axis and a second axis. Further, the first surface of the body is more proximate to the printed circuit board than the second surface such that the space between the first and second surfaces extends along or tangentially to a third axis substantially perpendicular to the first and second axes. Further, the first set of conductive contact beams extend from the first surface away from the printed circuit board at a first angle from the third axis. Further, the second set of conductive contact beams extend from the second surface towards the further at a second angle from the third axis.

Moreover, the at least one conductive contact beam of the first set of conductive contact beams is of a lesser length than the at least one conductive contact beam of the second set of conductive contact beams such that the second set of conductive contact beams extends a greater distance into the space between the first and second surfaces than the first set of conductive contact beams. Further, the at least one conductive contact beam of the first set of conductive contact beams is of a lesser width than the at least one conductive contact beam of the second set of conductive contact beams.

A contact bridge includes a central portion, a first receptacle engagement portion, and a second receptacle engagement portion. The central portion includes a first planar portion and spacer portion extending in a first direction from a first side of the first planar portion. The first receptacle engagement portion extends in a second direction from a second side of the first planar portion in the same plane as the first planar portion. The second receptacle engagement portion extends in a third direction from a third side of the first planar portion in the same plane as the first planar portion.

Further, the central portion includes a tab extending in a fourth direction from a fourth side of the first planar portion. The fourth side is opposite to the first side. In an embodiment, the first receptacle engagement portion includes a first discontinuity and the second receptacle engagement portion includes a second discontinuity. The first and second discontinuities are more proximate to the fourth side of the first planar portion than to first side of the first planar portion.

Moreover, the spacer portion has a second planar portion extending therefrom in a direction that is opposite to the first direction such that the second planar portion is substantially parallel to but displaced from the first planar portion. The second planar portion has an arching portion extending therefrom. The arching portion substantially encloses a volume in a circumferential manner. In an embodiment, a wire is disposed in the volume.

DETAILED DESCRIPTION

Reference will now be made to various embodiments, one or more examples of which are illustrated in the figures. The embodiments are provided by way of explanation of the invention, and are not meant as a limitation of the invention. For example, features illustrated or described as part of one embodiment may be used with another embodiment to yield still a further embodiment. It is intended that the present application encompass these and other modifications and variations as come within the scope and spirit of the invention.

Disclosed herein is a board-to-board connection system that includes at least two receptacle assemblies and a contact bridge. Such a connection system may be used to efficiently and reliably mechanically and electrically couple one or more printed circuit boards (PCBs) to each other. More specifically, the connection system enables efficient and rapid creation of an electrical and mechanical connection between two or more PCBs having the receptacle assemblies attached thereto through the insertion of the contact bridge into the receptacle assemblies. Such a connection requires no or minimal hand-soldering to facilitate the connection, and thus saves time over current methods. Further, the receptacle assemblies include multiple, broad contact points to increase the current-carrying capacity of the system. Additionally, the receptacle assemblies include vacuum pickup nozzles for automated placement of the PCBs in various systems for various uses. The unique design of the board-to-board connection system disclosed ensures that two or more PCBs (or other electrical components) can be efficiently and reliably connected and disconnected with one another. Furthermore, the design of the contact bridge allows for the introduction of power from a source external to the PCBs. This makes the board-to-board connection system disclosed herein ideal for high power applications. For example, in an example embodiment, the board-to-board connector may be used connect together multiple PCBs including LEDs in a LED lighting strip.

Various embodiments of a board-to-board connection system with a contact bridge are illustrated throughout FIGS. 1 through 6B. The board-to-board connection system disclosed in these figures is configured to electrically connect a first PCB (or other electrical component) including a first receptacle assembly to at least one other PCB including another receptacle assembly by disposing a contact bridge into the receptacle assemblies. In an embodiment, each of the receptacle assemblies includes at least one conductive contact beam. It should be appreciated that the board-to-board connection system disclosed herein is not limited by a maximum number of receptacle positions on the PCBs, contact beams within the receptacle assemblies, types of connections that couple each component together, or the type of PCB or electrical components with which the system is used.

Figure 1:
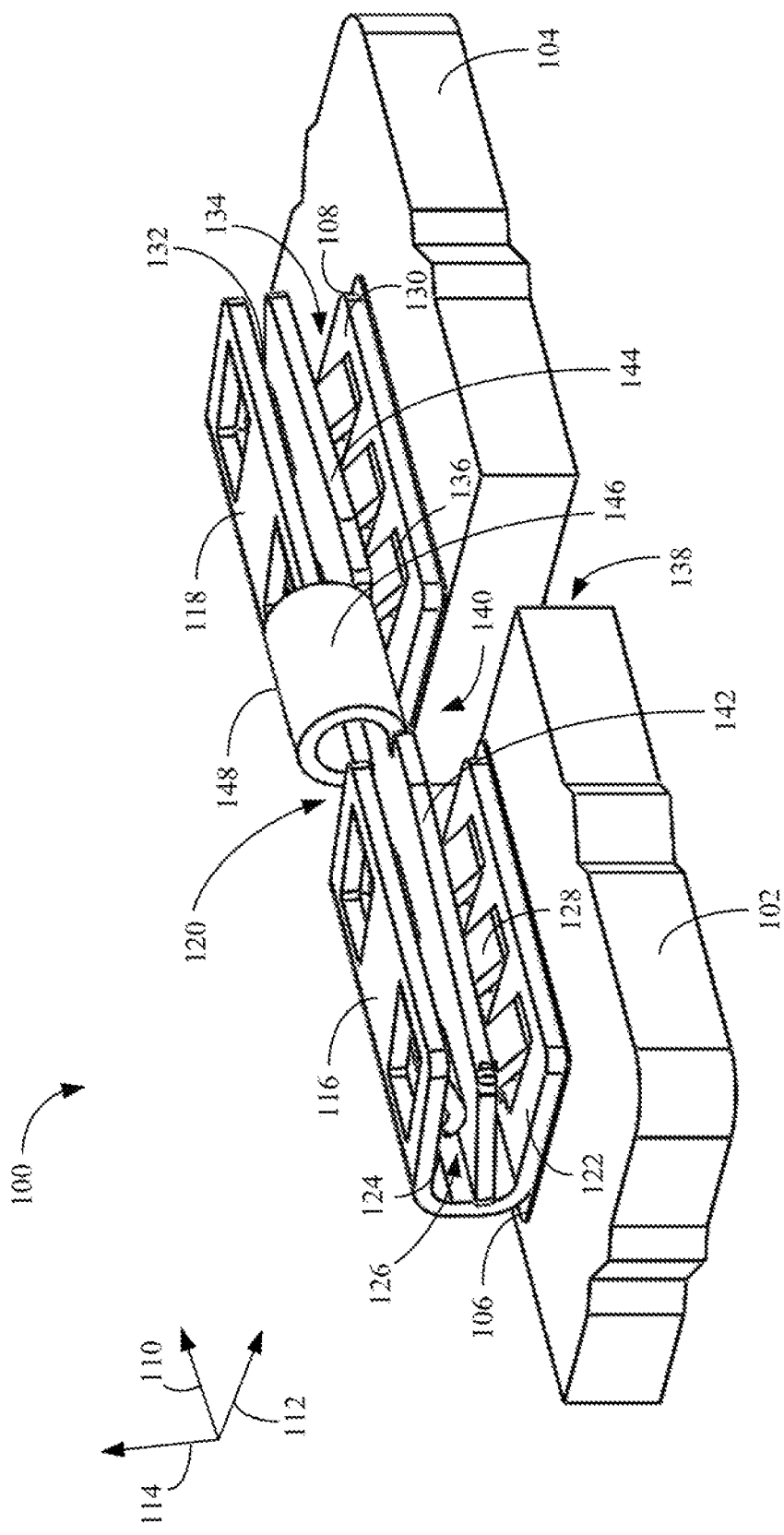
FIG. 1 depicts an isometric view of a board-to-board connection system in accordance with an illustrative embodiment.

Referring to FIG. 1 in general, a board-to-board connection system 100 is depicted as three separable elements in accordance with various illustrative embodiments. FIG. 1 is an isometric view of a board-to-board connection system 100 in accordance with an illustrative embodiment. As generally depicted in FIG. 1, the board-to-board connection system 100 connects a first printed circuit board (PCB) 102 to a second PCB 104. The first PCB 102 includes a first electrical pad 106 and the second PCB 104 includes a second electrical pad 108. In an embodiment, the first PCB 102 and the second PCB 104 are substantially planar and extend lengthwise along a first axis 110 and widthwise along a second axis 112 that is substantially perpendicular to the first axis 110. A third axis 114 is substantially perpendicular to both the first axis 110 and the second axis 112. The board-to-board connection system 100 includes a first receptacle assembly 116, a second receptacle assembly 118, and a contact bridge 120.

Referring generally to FIG. 1, the first receptacle assembly 116 includes a first surface 122 and a second surface 124. The first surface 122 is displaced from the second surface 124 to form a space 126 between the first surface 122 and the second surface 124. The first receptacle assembly 116 further includes at least one contact beam 128 attached to either the first surface 122 or the second surface 124 that extends into the space 126. The contact beam 128 has an electrically-conductive connection with the first electrical pad 106. The second receptacle assembly 118 includes a first surface 130 and a second surface 132. The first surface 130 is displaced from the second surface 132 to form a space 134 between the first surface 130 and the second surface 132. In an embodiment, the second surfaces 124 and 132 of the first and second receptacle assemblies 116 and 118 are displaced from the first surfaces 122 and 130 of the first and second receptacle assemblies 116 and 118 in the direction of the third axis 114. The second receptacle assembly 118 further includes at least one contact beam 136 attached to either the first surface 130 or the second surface 132 that extends into the space 134. The contact beam 136 has an electrically-conductive connection with the second electrical pad 108. The first PCB 102 is displaced from the second PCB 104 to create a gap 138 between the first receptacle assembly 116 and the second receptacle assembly 118.

In various embodiments, each of the first and second receptacle assemblies 116 and 118 includes a first set of conductive contact beams extending from the first surfaces 122 and 130 into the spaces 126 and 134 and a second set of conductive contact beams extending from the second surfaces 124 and 132 into the spaces 126 and 134. In some embodiments, the first sets of conductive contact beams include a greater number of conductive contact beams than the second sets of conductive contact beams. For example, in one embodiment, each of the first sets of conductive contact beams includes three conductive contact beams and each of the second sets of conductive contact beams includes two conductive contact beams. Alternatively, the first sets of conductive contact beams may include four or more conductive contact beams and the second sets of conductive contact beams may include any amount of conductive contact beams that is less than the number included in the first set. In other embodiments, the first set of conductive contact beams has the same number of conductive contact beams as the second set of conductive contact beams. In still other embodiments, the second set of conductive contact beams includes a greater number of conductive contact beams than the first set of conductive contact beams. When the system 100 is assembled, the contact bridge 120 is inserted between the first and second sets of conductive contact beams of the first and second receptacle assemblies 116 and 118.

The contact bridge 120 includes a central portion 140, a first receptacle engagement portion 142 extending from a first side of the central portion 140, and a second receptacle engagement portion 144 extending from a second side of the central portion 140. In the example shown, the first receptacle engagement portion 142 is engaged with the contact beam 128 of the first receptacle assembly 110 and the second receptacle engagement portion 144 is engaged with the contact beam 136 of the second receptacle assembly 118. Additionally, the contact bridge 120 also includes a spacer portion 146 extending from a third side of the central portion 140. In an embodiment, the spacer portion 146 includes a loop 148. The spacer portion 146 is disposed in the gap 138 between the first receptacle assembly 116 and the second receptacle assembly 118 to prevent movement of the contact bridge 120 along the first axis 110. In various embodiments, the spacer portion 146 is of a dimension along the first axis 110 that bears a relationship to the distance of the gap 138 between the first and second receptacle assemblies 116 and 118. For example, in one embodiment, the dimension of the spacer portion 146 is within a predetermined distance threshold of the distance of the gap 138.

Figure 2:
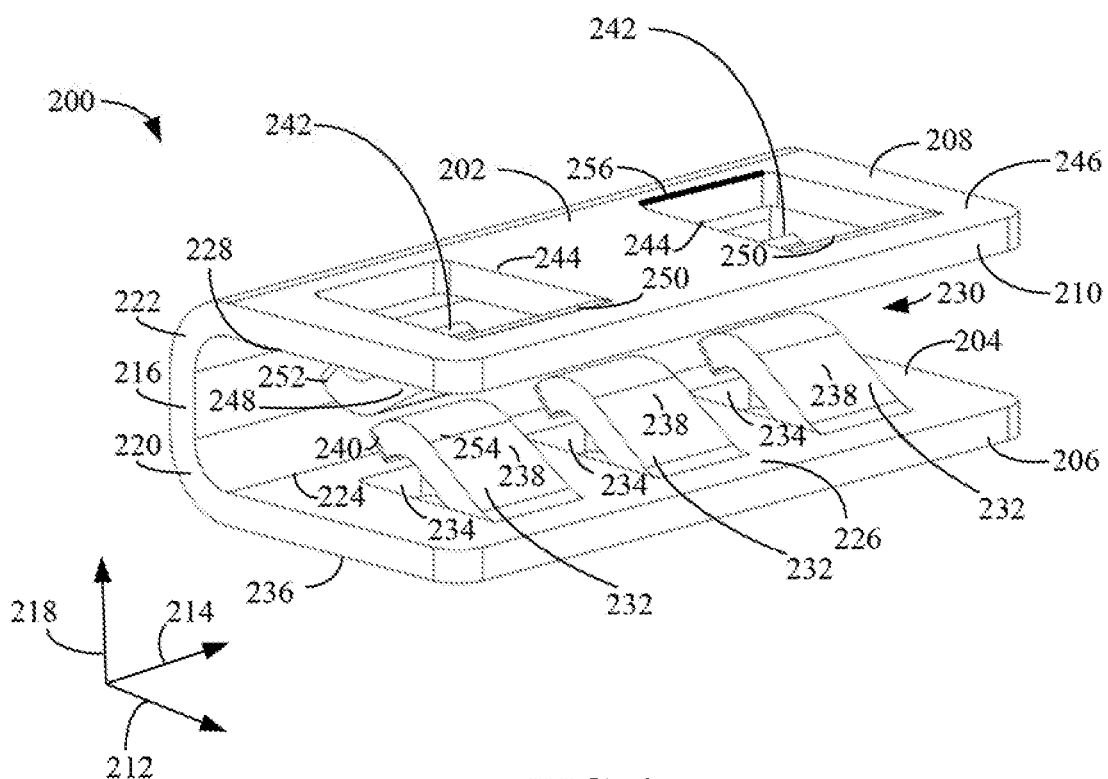
FIG. 2 depicts an isometric view of a receptacle assembly in accordance with an illustrative embodiment.

FIG. 2 depicts an isometric view of a receptacle assembly 200 in accordance with an illustrative embodiment. The receptacle assembly 200 is an illustrative embodiment of the first and second receptacle assemblies 116 and 118 of FIG. 1. In various embodiments, receptacle assembly 200 may be constructed of any electrically-conductive material such as a metal. The receptacle assembly 200 includes a body 202. The body 202 includes a first portion 204 having a first edge 206 and a second portion 208 having a second edge 210. In an embodiment, the first portion 204 is substantially planar and extends from the first edge 206 along a first axis 212 and the second portion 208 is substantially planar and extends from the second edge 210 along the first axis 212. Both the first portion 204 and the second portion 208 also extend along a second axis 214 that is substantially perpendicular to the first axis 212. In an embodiment, the body 202 includes a third portion 216 extending along the second axis 214 and a third axis 218 that is substantially perpendicular to both the first axis 212 and the second axis 214. The third portion 216 includes a first spacer portion 220 that is connected with the first portion 204 at an end 224 of the first portion 204 that is opposite to the first edge 206. The third portion 216 also includes a second spacer portion 222 that is connected with the second portion 208 at an end (not shown) that is opposite to the second edge 210. In an embodiment, the first portion 204, the second portion 208, and the third portion 216 are integrally formed such that the body 202 is a substantially C-shaped member.

The first portion 204 includes a first surface 226 and the second portion 208 has a second surface 228. The first surface 226 is displaced from the second surface 228 in a direction so as to create a space 230 between the first surface 226 and the second surfaces 228 of the body 202. In an embodiment, the space 230 extends the direction of the third axis 218. The space 230 allows room for the insertion of a contact bridge (e.g., the contact bridge 120) into the receptacle assembly 200 to create an electrical connection between the receptacle assembly and various other components (e.g., another receptacle assembly similar to the receptacle assembly 200). The receptacle assembly 200 further includes a first set of conductive contact beams 232. The first set of conductive contact beams 232 includes at least one conductive contact beam connected to and extending from the first surface 226 of the first portion 204 into the space 230 between the first surface 226 and the second surface 228. In an embodiment, the first set of conductive contact beams 232 includes three equally spaced conductive contact beams.

In an embodiment, the first portion 204 may include a cutout 234 for each conductive contact beam of the first set conductive contact beams 232. Each cutout 234 may include an opening in the first portion 204 that extends from the first surface 226 to a third surface 236 of the body 202 in the direction of the third axis 218. In an embodiment, each conductive contact beam of the first set of conductive contact beams 232 includes a planar portion 238 that is attached to an edge (not shown) of the cutout 234 that is proximate to the first edge 206 of the first portion 204. In the example shown, the planar portion 238 extends a first distance into the space 230 between the first surface 226 and the second surface 228 towards the third portion 216 at a first angle to the third axis 218. Each conductive contact beam 232 also includes an arching portion 240 that extends away from the second surface 228 towards the first spacer portion 220 of the third portion 216. The arching portions 240 facilitate the connection and disconnection of a contact bridge (e.g., the contact bridge 120 discussed above) to the receptacle assembly 200 by providing a non-planar contact surface. Such a non-planar contact surface reduces the friction between the first and second sets of conductive contact beams 232 and 242 and the contact bridge, which reduces the amount of force necessary to fully insert or remove the contact bridge into and out of the receptacle assembly 200. Thus, the unique design of the conductive contact beams facilitates the efficient connection and disconnection of various components The receptacle assembly 200 further includes a second set of conductive contact beams 242. The second set of conductive contact beams 242 are connected to and extend from the second surface 228 of the second portion 208 into the space 230 between the first surface 226 and the second surface 228. In an embodiment, the second set of conductive contact beams 242 includes two conductive contact beams. The second portion 208 may include a cutout 244 for each of the conductive contact beams 242. Each cutout 244 may include an opening in the second portion 208 that extends from the second surface 228 to a fourth surface 246 of the body 202 in the direction of the third axis 218. In an alternative embodiment to that depicted in FIG. 2, the first portion 204 and the second portion 208 do not include cutouts 234 and 244. In such embodiments, the first and second sets of conductive contact beams 232 and 242 are connected (e.g., soldered, welded, etc.) directly to the first and second surfaces 226 and 228.

Each of the conductive contact beams of the second set of conductive contact beams 242 may include a planar portion 248 that is attached to an edge 250 of the cutout 244 that is proximate to the second edge 210 of the second portion 208 and an arching portion 252 that extends towards the second spacer portion 222 of the third portion 216 of the body 202. The planar portion 248 extends a second distance into the space 230 between the first surface 226 and the second surface 228 towards the third portion 216 at a second angle relative to the third axis 218. In an embodiment, the second distance is greater than the first distance (i.e., the distance that the planar portions 238 of the first set of conductive contact beams 232 into the space 230 towards the third portion 216) because the planar portions 248 of the contact beams 242 have a greater length than the planar portions 238 of the contact beams 232. As such, the apex of the arching portions 252 of the conductive contact beams of the second set of conductive contact beams 242 is closer to the first surface 226 than the apex of the arching portions 240 of the conductive conduct beams of the first set of conductive contact beams 232. Referring back to FIG. 1, such a difference results in the contact bridge 120 discussed above extending at an angle relative to the first axis 212 when disposed between the first and second sets of conductive contact beams 232 and 242. In an embodiment, the second angle (i.e., the angle relative to the third axis 218 at which the planar portions 248 of the second set of contact beams 242 extends into the space 230) is greater than the first angle (i.e., the angle relative to the third axis 218 at which the planar portions 238 of the first set of contact beams 232 extends into the space 230). In an alternative embodiment, the second angle is smaller than the first angle. In yet another embodiment, the second angle is equivalent to the first angle.

In an embodiment, the planar and arching portions 238 and 240 of the first set of conductive contact beams 232 share a first dimension 254 (i.e., a width) in the direction of the second axis 214. The first dimension 254 may be within a predetermined threshold of a dimension of the edges (not shown) of cutouts 234 in the direction of the second axis 214. The planar and arching portions 248 and 252 of the second set of conductive contact beams 242 share a second dimension (not shown) in the direction of the second axis 214. The second dimension may be within the predetermined distance threshold of a dimension 256 of the edges 250 of the cutouts 244 in the direction of the second axis 214. In an embodiment, the second dimension 256 is greater than the first dimension 254 by more than the predetermined threshold. In other words, a width of the conductive contact beams of first set of conductive beams 232 in the direction of the second axis 214 is less than a width of the conductive contact beams of the second set of conductive beams 242 in the direction of the second axis 214. As such, the cutouts 244 are of a greater width than the cutouts 234. This allows space for a pickup nozzle to engage with the receptacle assembly 200 via the cutouts 244 when the receptacle portion is attached to a printed circuit board, enabling automated placement of the printed circuit board and efficient assembly. Referring back to FIG. 1, the difference in length between the planar portions 238 and 248 of the conductive contact beams 232 and 242 is compensated by this difference in width along the second axis 214 such that the second set of conductive contact beams 242 impart a substantially similar amount of force on the contact bridge 120 as the first set of conductive contact beams 232. As such, the receptacle assembly 200 is able to maintain a stable relationship with the contact bridge 120.

Figure 3:
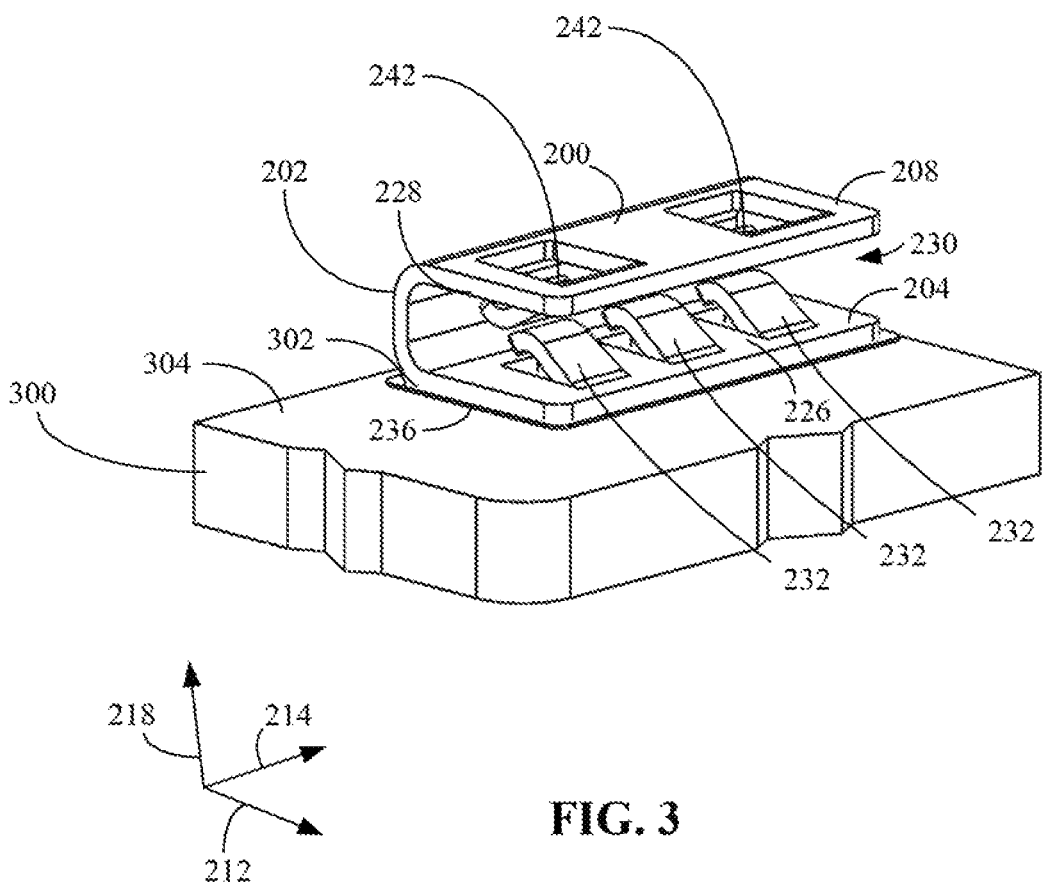
FIG. 3 depicts an isometric view of a receptacle assembly attached to a printed circuit board in accordance with an illustrative embodiment.

FIG. 3 depicts an isometric view of the receptacle assembly 200 attached to a printed circuit board 300 in accordance with an illustrative embodiment. Like reference numerals are used in FIG. 3 to describe features discussed above. In the example shown in FIG. 3, an electrical pad 302 is attached to a surface 304 of the PCB 300. The PCB 300 is planar and extends along the first axis 212 and the second axis 214. The body 202 of the receptacle assembly 200 is attached to the PCB 300. In an embodiment, the third surface 236 of the body 202 is attached to the electrical pad 302. In an embodiment, the third surface 236 of the body 202 is soldered to the electrical pad 302. As such, the first surface 226 of the first portion 204 is nearer the PCB 300 than the second surface 228 of the second portion 208 such that the space 230 between the first surface 226 and the second surface 228 extends along the third axis 218 away from the PCB 300. The first set of conductive contact beams 232 extends from the first surface 226 into the space 230 at a first angle from the third axis 218 away from the PCB 300 and the second set of conductive contact beams 242 extends from the second surface 228 of the second portion 208 into the space 230 at a second angle from the third axis 218 towards the PCB 300. As such, the apexes of the arching portions 252 of the second set of conductive contact beams 242 is closer to the PCB 300 than the apexes of the arching portions 240 of the first set of conductive contact beams 232.

Figure 4:
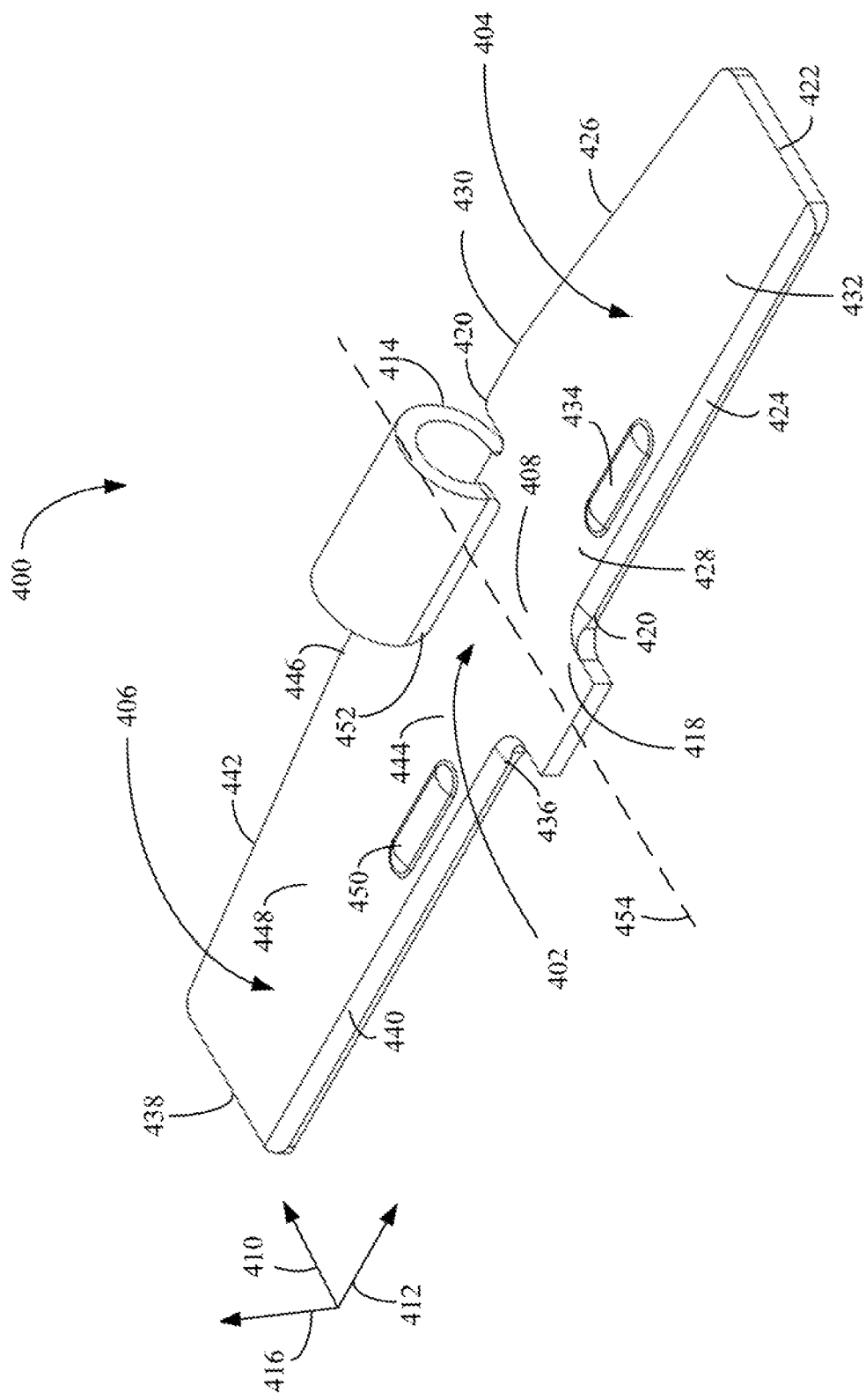
FIG. 4 depicts an isometric view of a contact bridge in accordance with an illustrative embodiment.

FIG. 4 depicts an isometric view of a contact bridge 400 in accordance with an illustrative embodiment. In an example embodiment, the contact bridge 400 is an example embodiment of the contact bridge 120 discussed above in relation to FIG. 1. The contact bridge 400 may be constructed of any electrically-conductive material, such as a metal. The contact bridge 400 includes a central portion 402, a first receptacle engagement portion 404, and a second receptacle engagement portion 406. The central portion 402 includes a planar portion 408. In an embodiment, the planar portion 408 extends along a first axis 410 and a second axis 412.

The central portion 402 further includes a spacer portion 414 extending from a first side of the planar portion 408 in the direction of the first axis 410. The spacer portion 414 curves such that it includes a portion that extends tangentially to a third axis 416 that is perpendicular to the first axis 410 and the second axis 412. In an embodiment, the spacer portion 414 continuously curves at a first radius of curvature such that an edge 452 of the spacer portion 414 is above the planar portion 408 in the direction of the third axis 416. In such embodiments, the spacer portion 414 substantially forms a loop enclosing a substantially cylindrical volume above the planar portion in the direction of the third axis 416. In various other embodiments, the spacer portion 414 does not continuously curve at the first radius of curvature. For example, in some embodiments, the spacer portion 414 curves at a variable rate of curvature. For example, in one embodiment, the spacer portion 414 curves at an increasing radius of curvature with distance from the planar portion 408. In another embodiment, the spacer portion 414 curves at an increasing radius of curvature with distance from the planar portion 408. In various other embodiments, the spacer portion 414 may not be curved at all. For example, in one embodiment, the spacer portion 414, extends directly upward from the planar portion 408 in the direction of the third axis 416. In yet still other embodiments, the contact bridge 400 does not include the spacer portion 414.

The central portion 402 further includes a tab 418 extending from a second side of the planar portion 408 in the direction of the first axis 410. The first side of the central portion 402 is opposite to the second side of the central portion 402. In an embodiment, the tab 418 has a width in the direction of the first axis 410 that is within a predetermined threshold of a gap (e.g., the gap 138 discussed above) between receptacle assemblies (e.g., the first and second receptacle assemblies 116 and 118) into which the contact bridge 400 is inserted to prevent the contact bridge 400 from moving when the first and second receptacle engagement portions are inserted into receptacle assemblies (such as the receptacle assembly 200 discussed above). In various embodiments, the bridge contact 400 is symmetrical about a central axis 454 extending through the center of the central portion 402. Such symmetry facilitates the insertion of the first and second receptacle engagement portions 404 and 406 into substantially similar receptacle assemblies (such as the receptacle assembly 200 discussed above). In other embodiments, the bridge contact 400 may by asymmetrical about the central axis 454. For example, the length of the first receptacle engagement portion 404 (i.e., the distance between the central axis 454 and the distal end 422) may differ from that of the second receptacle engagement portion 406 to enable the contact bridge 400 to be inserted into differently configured receptacle assemblies.

The first receptacle engagement portion 404 extends in a third direction from the planar portion 408 in the direction of the second axis 412. In an embodiment, the first receptacle engagement portion 404 is substantially planar and is co-planar with the planar portion 408. The first receptacle engagement portion 404 includes a proximal end 420 and a distal end 422. Both the proximal end 420 and the distal end 422 extend in a direction that is substantially parallel to the first axis 410 from a first edge 424 to a second edge 426 of the first receptacle engagement portion 404. The first receptacle engagement portion 404 further includes a proximal portion 428 extending from the proximal end 420 in a direction substantially parallel to the first axis 410 to a dividing boundary 430. In an embodiment, the proximal portion 428 is of a constant dimension in the direction of the first axis 410 as the proximal portion 428 extends in the direction of the second axis 412. The constant dimension defines the distance between the first and second edges 424 and 426 of the proximal portion 428 in the direction of the first axis 410. Thus, along the proximal portion 428, the distance between the first and second edges 424 and 426 is constant.

The first receptacle engagement portion 404 further includes a distal portion 432 extending from the dividing boundary 430 to the distal end 422. In an embodiment, a dimension of distal portion 432 in the direction of the first axis 410 decreases with distance from the dividing boundary 430. The decreasing dimension is a distance between the first and second edges 424 and 426 of the distal portion 432 in the direction of the first axis 410. Thus, the distance between the first and second edges 424 and 426 along the distal portion 432 decreases with distance from the dividing boundary 430. In an embodiment, the distance between the first and second edges 424 and 426 decreases linearly with distance from the dividing boundary 430. In the example shown, the decrease in dimension of the distal portion 432 is caused by the second edge 426 extending at an angle to second axis 412 when the first edge 424 extends in a direction that is substantially parallel to the second axis 412. In various embodiments, there is a discontinuity at the second edge 426 at the dividing boundary 430 since the dimension of the proximal portion 428 is relatively more constant with distance from the proximal end 420 than is the dimension of the distal portion 432. Such a configuration (i.e., the decreasing dimension of the distal portion 432) results in the bridge contact 400 taking up less functional space when attached to receptacle assemblies on, for example a pair of PCBs. In various embodiments, the central portion 402 is disposed in a gap between two PCBs. As such, the distal end 422 is nearer to the center of the PCB than the proximal end 420. Thus, the diminishing dimension of the distal portion 432 minimizes the amount of the PCB that the bridge contact 400 covers towards the PCB's center, and maximizes space available for other components.

In an embodiment, the first edge 424 of the first receptacle engagement portion 404 is tapered. In an embodiment, the contact bridge 400 is inserted into a receptacle assembly (e.g., in the receptacle assembly 200 discussed above in relation to FIG. 2) with the first edge 424 of the first receptacle engagement portion 404 being the leading edge. Thus, the tapering of the first edge 424 facilitates the insertion of the contact bridge 400 between receptacle engagement members (e.g., between the first and second sets of conductive contact beams 232 and 242 discussed above) of the receptacle assembly.

To facilitate the contact bridge 400 remaining engaged with a receptacle assembly, first receptacle engagement portion 404 further includes at least one discontinuity 434. In an example embodiment, the discontinuity 434 is disposed more proximate to the first edge 424 than to the second edge 426. As will be described below (see FIG. 7), such an arrangement facilitates the engagement of the discontinuities with receptacle engagement members (e.g., conductive contact beams 232 and 242 discussed above) of the receptacle assembly when the contact bridge 400 is inserted into the receptacle assembly. In one embodiment, the first receptacle engagement portion includes a single discontinuity 434. The single discontinuity 434 includes a retention bump extending in the direction of the first axis 410. In an embodiment, the discontinuity 434 extends over or across the dividing boundary 430. In another embodiment, the discontinuity 434 is disposed completely within the proximal portion 428. In yet another embodiment, the discontinuity is disposed completely within the distal portion 432. In some embodiments, the first receptacle engagement portion 404 includes two or more discontinuities. The discontinuities may be spaced apart in a direction along the second axis 412 by an amount that corresponds to the spacing of receptacle engagement members of a receptacle assembly (e.g., the second set of conductive contact beams 242 of the receptacle assembly 200).

Still referring to FIG. 4, the second receptacle engagement portion 406 extends in a fourth direction from the planar portion 408 in the direction of the first axis 410. In an embodiment, the second receptacle engagement portion 406 is substantially planar and is co-planar with the planar portion 408. The second receptacle engagement portion 406 includes a proximal end 436 and a distal end 438. Both the proximal end 436 and the distal end 438 extend in a direction that is substantially parallel to the first axis 410 from a first edge 440 to a second edge 442 of the second receptacle engagement portion 406. The second receptacle engagement portion 406 further includes a proximal portion 444 extending from the proximal end 436 in a direction substantially parallel to the second axis 412 to a dividing boundary 446. In an embodiment, the proximal portion 444 is of a constant dimension in the direction of the first axis 410. In other words, along the proximal portion 444, the distance between the first and second edges 424 and 426 is constant as the proximal portion 444 extends in the direction of the second axis 412.

The second receptacle engagement portion 406 further includes a distal portion 448 extending from the dividing boundary 446 to the distal end 438. In an embodiment, a dimension of distal portion 448 in the direction of the first axis 410 decreases with distance from the dividing boundary 446 in the direction of the second axis 412. Put differently, the distance between the first and second edges 440 and 442 along the distal portion 448 decreases with distance from the dividing boundary 446. In an embodiment, the distance between the first and second edges 440 and 442 decreases linearly with distance from the dividing boundary 446. In the example shown, the decrease in dimension of the distal portion 448 is caused by the second edge 442 extending at an angle to second axis 412 when the first edge 440 extends in a direction that is substantially parallel to the second axis 412. In various embodiments, there is a discontinuity at the second edge 442 at the dividing boundary 446 since the dimension of the proximal portion 444 is relatively more constant with distance from the proximal end 436 than is the dimension of the distal portion 448.

In an embodiment, the first edge 440 of the second receptacle engagement portion 406 is tapered. In an embodiment, the contact bridge 400 is inserted into a receptacle assembly (e.g., in the receptacle assembly 200 discussed above in relation to FIG. 2) with the first edge 440 of the second receptacle engagement portion 406 being the leading edge. Thus, the tapering of the first edge 440 facilitates the insertion of the contact bridge 400 between receptacle engagement members (e.g., between the conductive contact beams 232 and 242 discussed above) of the receptacle assembly.

To facilitate the contact bridge 400 remaining engaged with a receptacle assembly, second receptacle engagement portion 406 further includes at least one discontinuity 450. In an example embodiment, the discontinuity 450 is disposed more proximate to the first edge 440 than to the second edge 442. Such an arrangement facilitates the engagement of the discontinuity 450 with receptacle engagement members (e.g., conductive contact beams 232 and 242 discussed above) of the receptacle assembly when the contact bridge 400 is inserted into the receptacle assembly. In one embodiment, the second receptacle engagement portion 406 includes a single discontinuity 450. The single discontinuity 450 includes a retention bump extending in the direction of the first axis 410. In an embodiment, the discontinuity 450 extends over the dividing boundary 446. In another embodiment, the discontinuity 450 is disposed completely within the proximal portion 444. In yet another embodiment, the discontinuity is disposed completely within the distal portion 448. In some embodiments, the second receptacle engagement portion 406 includes two or more discontinuities. The discontinuities may be spaced apart in a direction along the first axis 410 by an amount that corresponds to the spacing of receptacle engagement members of a receptacle assembly (e.g., the second set of conductive contact beams 242 of the receptacle assembly 200).

Figure 5:
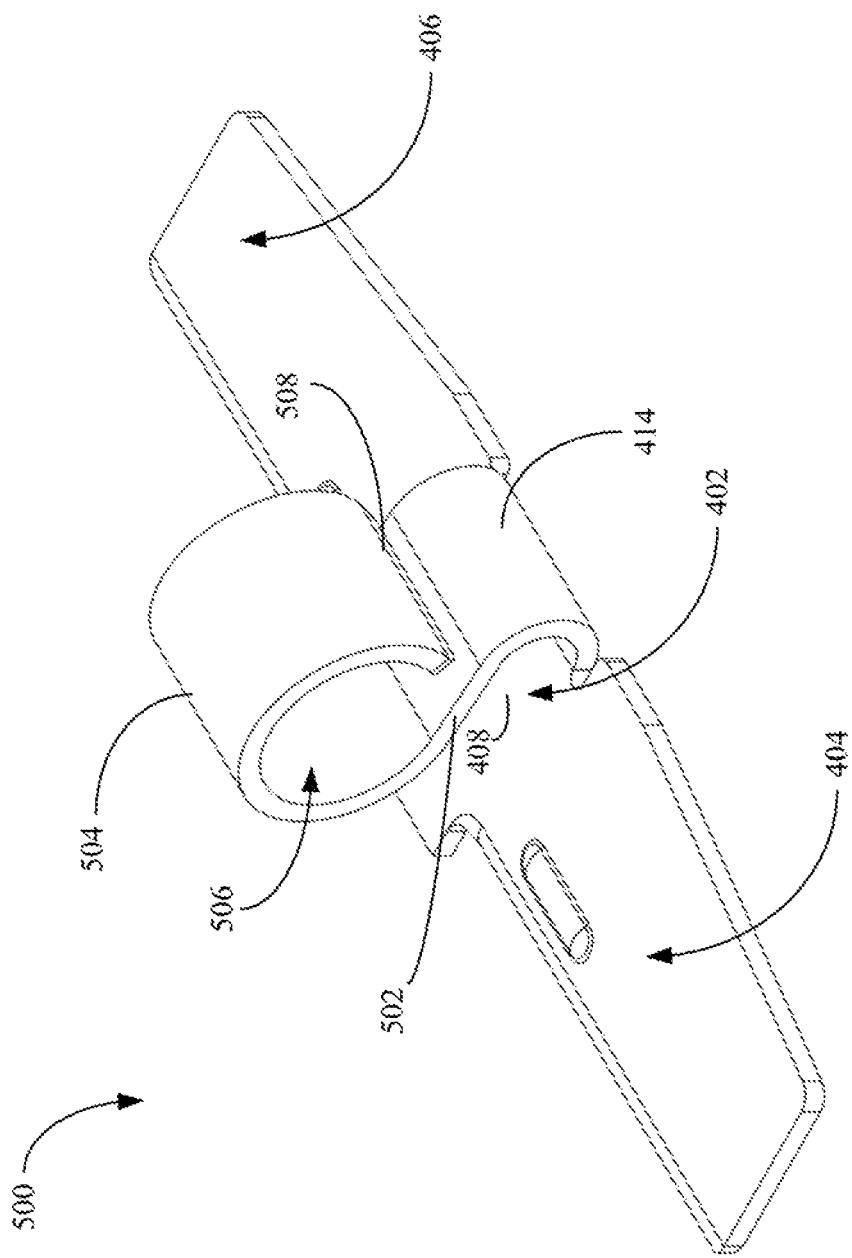
FIG. 5 depicts an isometric view of a contact bridge in accordance with an illustrative embodiment.
Figure 5:
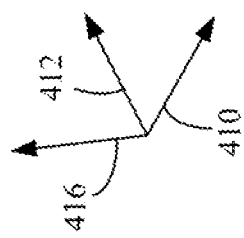

FIG. 5 an isometric view of another contact bridge 500 in accordance with an illustrative embodiment. In the illustrative embodiment shown, the contact bridge 500 shares many of the same characteristics as the contact bridge 400 discussed above in relation to FIG. 4. Accordingly, the contact bridge 500 is shown to include a central portion 402, a first receptacle engagement portion 404, and a second receptacle engagement portion 406. The first receptacle engagement portion 404, and second receptacle engagement portion 406 of the contact bridge 500 may include all of the same features as those of the contact bridge 400 discussed above in relation to FIG. 4.

In an embodiment, the difference between the contact bridge 400 and the contact bridge 500 lies in the central portions 402. Recall that, in the embodiment shown in FIG. 4, the central portion 402 includes a spacer portion 414 that continuously curves at a first radius of curvature so as to enclose a substantially cylindrical volume above the planar portion 408 in the direction of the third axis 416. In the embodiment shown in FIG. 5, the spacer portion 414 extends into an extending portion 502. The extending portion 502 facilitates another portion (e.g., the arching portion 504 described below) enclosing a volume above the planar portion 408 closer to the center of the planar portion 408 than the spacer portion 414. As a result, an object (e.g., a wire) may be inserted into the enclosed volume while minimally impacting the center of gravity of the bridge contact 500 in the direction of the first axis 410. Thus, the extending portion 502 facilitates the introduction of additional components into and/or connection with the contact bridge 500 while minimizing any adverse effects on the connection of the contact bridge 500 to the receptacle assemblies. The extending portion 502 extends back over the planar portion 408 in the direction of the first axis 410. In an embodiment, the extending portion 502 is substantially planar and is substantially parallel to the planar portion 408, but displaced from the planar portion 408 in the direction of the third axis 416. In various other embodiments, the extending portion 502 may be of a different configuration. For example, rather than being planar, the extending portion 502 may curve in a direction that is opposite to the curve of the spacer portion 414. The extending portion 502 may be curved at a radius of curvature that is less than the radius of curvature than the spacer portion 414. In another embodiment, the extending portion 502 is omitted, and the spacer portion extends directly into the arching portion 504 described below.

In the illustrative embodiment shown, the central portion 402 further includes an arching portion 504 extending from the extending portion 502. The arching portion 504 extends in a direction away from the planar portion 408 that is substantially parallel to the third axis 416. In an embodiment, the arching portion 504 continuously curves at a second radius of curvature such that an edge 508 of the arching portion 504 is proximate to the extending portion 502. As such, the arching portion 504 substantially encloses a substantially cylindrical volume 506. In various other embodiments, the arching portion 504 may extend in the direction of the third axis 416 in any manner. For example, rather than continuously curving, the arching portion 504 may include a first portion extending in the direction of the third axis 416, a second portion extending back towards the spacer portion 414 in the direction of the first axis 410, and a third portion extending back towards the planar portion 408 in the direction of the third axis 416.

Figure 6A:
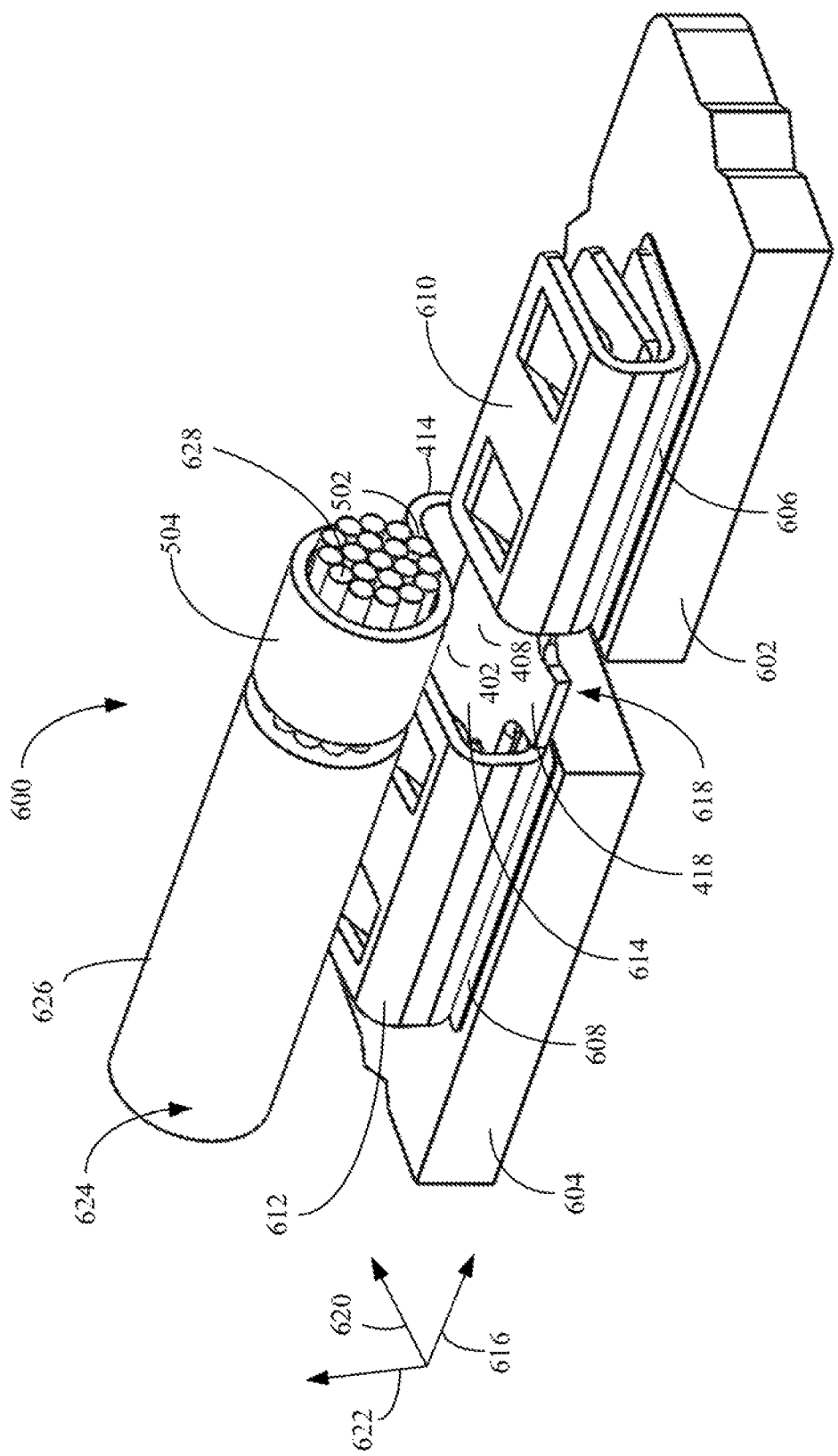
FIG. 6A depicts an isometric view of a board-to-board connection system in accordance with another illustrative embodiment.
Figure 6B:
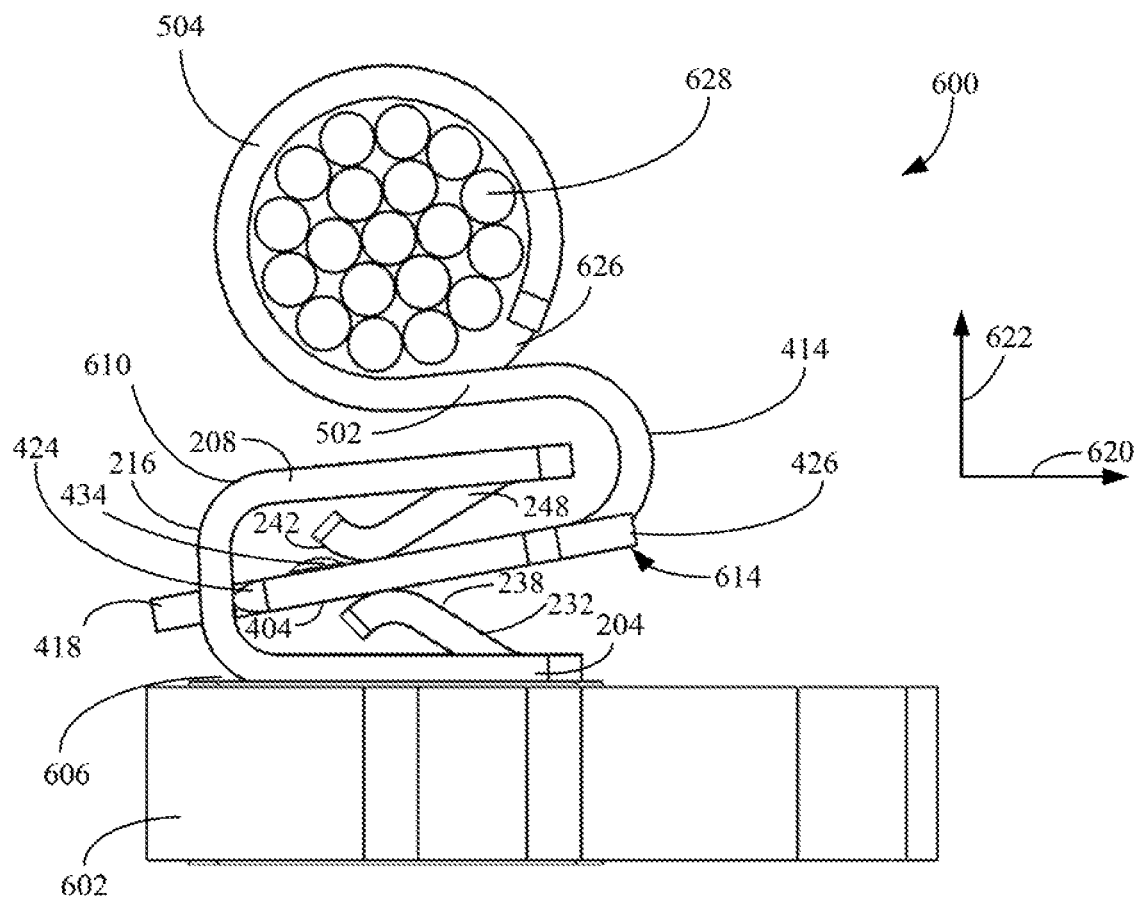
FIG. 6B depicts an end view of a board-to-board connection system in accordance with an illustrative embodiment.

Referring now to FIGS. 6A and 6B, two different views of a board-to-board connection system 600 is shown in accordance with various illustrative embodiments. FIG. 6A depicts an isometric view of a board-to-board connection system 600 in accordance with an illustrative embodiment. FIG. 6B depicts a second isometric view of a board-to-board connection system 600 in accordance with an illustrative embodiment. The board-to-board connection system 600 connects a first printed circuit board (PCB) 602 to a second PCB 604. The first PCB 602 includes a first electrical pad 606 and the second PCB 604 includes a second electrical pad 608. The board-to-board connector 600 includes a first receptacle assembly 610, a second receptacle assembly 612, and a contact bridge 614. In an embodiment, each of the receptacle assemblies 610 and 612 are identical to the receptacle assembly 200 discussed above in relation to FIG. 2. Further, the contact bridge 614 comprises the contact bridge 500 discussed above in relation to FIG. 5. Accordingly, FIGS. 6A and 6B illustrate an embodiment where the contact bridge 500 is inserted between the first and second sets of conductive contact beams 232 and 242 of the receptacle assembly 200 discussed above.

Referring to FIG. 6A, the first PCB 602 is displaced from the second PCB 604 in the direction of a first axis 616 so as to create a gap 618 between the first receptacle assembly 610 and the second receptacle assembly 612. The contact bridge 614 includes a central portion 402 having a planar portion 408. In an embodiment, the planar portion 408 extends along a first axis 616 and a second axis 620 that is substantially perpendicular to the first axis 616. The contact bridge 614 includes a tab 418 extending from the planar portion 408 in the direction of the second axis 620. The tab 418 disposed in the gap 618 to prevent movement of the contact bridge 614 along the first axis 616. The central portion 402 further includes a spacer portion 414 extending in the direction of the second axis 620 from the planar portion 408. The spacer portion 414 curves such that the spacer portion 414 extends a distance along a third axis 622 that is perpendicular to both the first and second axes 616 and 620. The central portion 402 further includes an extending portion 502 extending from the spacer portion 414 in the direction of the second axis 620 such that the extending portion 502 is above the planar portion 408 in the direction of the third axis 622. The central portion 402 further includes an arching portion 504 extending from the extending portion 502. In the example shown, the arching portion is continuously curved at a radius of curvature so as to substantially enclose a cylindrical volume above the extending portion 502 in the direction of the third axis 622.

A cable 624 is connected to the board-to-board connector 600. Cable 624 may include any current carrying medium. In an embodiment, the cable 624 includes the wiring for an LED lighting strip. Cable 624 is shown to include an outer insulation layer 626 and inner conductors 628. In various embodiment, the cable 624 may include additional components such as dielectric insulation and a metal shielding layer. In the example shown, the inner conductors 628 are inserted into the volume enclosed by the arching portion 504. The outer insulation layer 626 is stripped away from the cable 624 such that the inner conductors 628 have a conductive connection with the contact bridge 614. In an embodiment, the inner conductors 628 may be soldered to the arching portion 504. In another embodiment, the arching portion 504 is crimped or compressed to form an electrically-conductive connection with the inner conductors 628. In yet another embodiment, a portion of the inner conductors 628 may be bent around a portion of the arching portion 504. For instance, a portion of the inner conductors 628 may bend around an edge (e.g., the edge 508 discussed above) of the arching portion 504 to mechanically connect the cable 624 to the contact bridge 614. Through any of these connections, current from the cable 624 may flow into the contact bridge 614 and to the electrical pads 606 and 608 of the PCBs 602 and 604 via the receptacle assemblies 610 and 612. Thus, the board-to-board connector 600 enables power from an external source to be introduced to the PCBs 602 and 604. As such, the connector 600 is well suited for high power end-to-end adjoining of various PCBs, such as for LED lighting strips.

Referring now to FIG. 6B, the contact bridge 614 is inserted between the first and second sets of conductive contact beams 232 and 242 of the receptacle assembly 610. While only the first receptacle assembly 610 is shown in FIG. 6*b*, it should be understood that the contact bridge 614 is similarly positioned in the second receptacle assembly 612. In the illustrative embodiment shown, the first receptacle engagement portion 404 of the contact bridge 614 is inserted between first set of conductive contact beams 232 and the second set of contact beams 242 of the first receptacle assembly 610. The first edge 424 of the first receptacle engagement portion 404 abuts against a surface of the third portion 216 of the first receptacle assembly 610. As a result, the discontinuity 434 of the first receptacle engagement portion is proximate to a surface of the at least one of the conductive contact beams of the second set of conductive contact beams 242. As a result, the discontinuity 434 prevents the contact bridge 614 from moving in the direction of the second axis 620 once the contact bridge 614 is fully inserted between the conductive contact beams 232 and 242. Also shown is that the planar portions 238 of the first set of conductive contact beams 232 are of a lesser length than the planar portions 248 of the second set of conductive contact beams 242, resulting in the first receptacle engagement portion 404 being tilted at a first angle with respect to the second axis 620. Further, as a result of the forces applied to the second set conductive contact beams 242 due the insertion of the contact bridge 614, the second portion 208 of the first receptacle assembly 610 is tilted at a second angle with respect to the second axis 620, while the first portion 204 of the receptacle assembly 610 is substantially parallel to the second axis 620. In an embodiment, the second angle is less than the first angle. In another embodiment, the first angle is substantially equivalent to the second angle. In yet still other embodiments, the second angle is greater than the first angle.

In the example shown, the tab 418 of the contact bridge 614 extends beyond the third portion 216 of the receptacle assembly 610 at the tilt at the first angle from the second axis 620. As such, the tab 418 extends beyond the first edge 424 of the first receptacle engagement portion 404. Further, the spacer portion 414 of the contact bridge 614 curves at a first radius of curvature such that a portion thereof extends beyond the second edge 426 of the first receptacle engagement portion 404 in the direction of the second axis 620 and upward of the second portion 208 of the receptacle assembly 610 in the direction of the third axis 622. In some embodiments, rather than curving at a constant radius of curvature, the spacer portion 414 extends at a variable rate of curvature. In some embodiments, the spacer portion 414 is not curved, but extends directly upward from the planar portion 408 (not shown) of the contact bridge 614 substantially in the direction of the third axis 622. In one example, the spacer portion 414 extends at the first angle from the third axis 622 such that the spacer portion 414 extends perpendicularly to the first receptacle engagement portion 404. In some embodiments, the contact bridge 614 does not include the extending portion 502, and the extending portion 502 and arching portion 504 are separately attached to the receptacle assembly 610 (and the receptacle assembly 612).

In the example shown, the portion of spacer portion 414 that is above the second portion 208 in the direction of the third axis 622 has an extending portion 502 extending therefrom. The extending portion 502 extends back towards the third portion 216 of the receptacle assembly 610. In the example shown, the extending portion 502 is substantially parallel (i.e. tilted at the second angle with respect to the second axis 620) to the second portion 208 of the receptacle engagement portion 610 and displaced from the second portion 208 in the direction of the third axis 622. In various embodiments, the extending portion 502 is not substantially parallel to second portion 208 of the receptacle assembly 610. For example, in one embodiment, the extending portion 502 extends at a tilt to the second axis 620 that is greater than the second angle such that the extending portion 502 converges with the second portion 208. In such embodiments, extending portion 502 may abut against the second portion 208. In other embodiments, the extending portion is tilted at an angle with respect to the second axis 620 that is less than or opposite to the second angle such that the extending portion 502 diverges from the second portion 208. In still other embodiments, the extending portion 502 is not displaced from the second portion 208 in the direction of the third axis 622. In other words, the extending portion 502 is mechanically engaged with the second portion 208.

The extending portion 502 has an arching portion 504 extending therefrom. In the example shown, the arching portion 504 curves upward in the direction of a third axis 622 at a second radius of curvature that is greater than the first radius of curvature of the spacer portion 414. In another embodiment, the second radius of curvature may be smaller than the first radius of curvature. In yet another embodiment, the second radius of curvature may be substantially equivalent to the first radius of curvature. In yet still other embodiments, the arching portion 504 extends at a variable radius of curvature. For example, the radius of curvature may start at a relatively high radius of curvature and decrease with distance of the extending portion 502 such that the volume enclosed by the arching portion 504 is displaced from the extending portion 502 in the direction of the third axis 622. In yet still other embodiments, the arching portion 504 is not curved, but includes a plurality of planar portions that are arranged to substantially enclose a volume being substantially parallel to the printed circuit board 602. For example, the arching portion 504 may include three planar portions enclosing a substantially rectangular volume.

In the example shown, the arching portion 504 continuously curves at the second radius of curvature such that the arching portion substantially encloses a cylindrical volume to enclose the inner conductors 628 of a cable. The cable also includes an outer insulating layer 626. In the example shown, the outer insulating layer 626 is removed from the cable where the cable meets the arching portion 504 so as to create an electrically-conductive connection between the inner conductors 628 and the arching portion 504 and/or extending portion 502. As such, current from the inner conductors 628 flows from the extending portion 502 to the other components of the contact bridge 614 and from there to the receptacle assembly 610 and finally the electrical pad 606. Thus, current from the cable may be introduced to power various components (e.g., LEDs) on the PCB 602.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A system comprising:
    a first printed circuit board including a first electrical pad;
    a first receptacle assembly connected to the first electrical pad, the first receptacle assembly comprising a first surface and a second surface, the first surface being displaced from the second surface so as to form a first space between the first surface and the second surface, the first receptacle assembly further comprising a contact beam attached to either the first surface or the second surface and extending toward the first space, the contact beam having an electrically-conductive connection with the first electrical pad;
    a second printed circuit board including a second electrical pad;
    a second receptacle assembly connected to the second electrical pad, the second receptacle assembly comprising a first surface and a second surface, the first surface being displaced from the second surface so as to form a second space between the first surface and the second surface, the second receptacle assembly further a contact beam attached to either the first surface or the second surface and extending towards the second space, the contact beam having an electrically-conductive connection with the second electrical pad; and
    a contact bridge having a central portion, a first receptacle engagement portion extending from a first side of the central portion, and a second receptacle engagement portion extending from a second side of the central portion, wherein the first receptacle engagement portion is engaged with the contact beam of the first receptacle assembly, and wherein the second receptacle engagement portion is engaged with the contact beam of the second receptacle assembly;
    wherein the first and second receptacle assemblies each includes a first set of contact beams extending from the first surfaces and a second set of contact beams extending from the second surfaces; and
    wherein, upon engagement of the contact bridge with the first receptacle assembly and the second receptacle assembly, a largest surface of the first printed circuit board extends in a same plane as a largest surface of the second printed circuit board.

2. The system of claim 1, wherein the first printed circuit board is displaced from the second circuit board so as to create a gap between the first receptacle assembly and the second receptacle assembly, and wherein the contact bridge comprises a tab extending from a third side of the central portion, the tab positioned within the gap to prevent movement of the contact bridge along a first axis of the first and second printed circuit boards.

3. The system of claim 2, wherein the second surfaces of the first and second receptacle assemblies are displaced from the first surfaces of the first and second receptacle assemblies in a direction of a second axis that is substantially perpendicular to the first axis.

4. The system of claim 3, the first and second receptacle engagement portions of the contact bridge being disposed between the first and second sets of contact beams, wherein each of the contact beams in the first sets of contact beams are of a first dimension in a direction that is substantially parallel to the first axis, wherein each of the contact beams in the second sets of contact beams are of a second dimension in the direction that is substantially parallel to the first axis, wherein the second dimension is larger than the first dimension.

5. The system of claim 4, wherein each of the contact beams of the first sets of conductive contact beams is of a lesser length than each of the contact beams of the second sets of contact beams such that the first and second receptacle engagement portions of the contact bridge are tilted with respect to a third axis that is substantially perpendicular to both the first and second axes.

6. The system of claim 1, wherein the central portion of the contact bridge comprises a loop disposed in a gap between the first and second receptacle assemblies so as to prevent movement contact bridge along a first axis of the first and second printed circuit boards.

7. The system of claim 1, wherein the central portion of the contact bridge comprises a bend, a planar portion extending from the bend, and an arching portion extending from the planar portion, the arching portion substantially enclosing a volume in a circumferential manner.

8. The system of claim 7, wherein a wire is disposed in the volume substantially enclosed by the arching portion.

9. The contact bridge of claim 1, wherein a surface of the first receptacle engagement portion includes a first discontinuity to prevent inadvertent disengagement of the first receptacle engagement portion from the first receptacle assembly.

10. The contact bridge of claim 9, wherein a surface of the second receptacle engagement portion includes a second discontinuity to prevent inadvertent disengagement of the second receptacle engagement portion from the second receptacle assembly.

11. The contact bridge of claim 1, wherein the central portion includes a first planar portion and a spacer portion extending from a first side of the first planar portion.

12. The contact bridge of claim 11, wherein the spacer portion includes a second planar portion such that the second planar portion is substantially parallel to but displaced from the first planar portion.

13. The contact bridge of claim 12, wherein the spacer portion further includes an arching portion extending therefrom, the arching portion at least partially enclosing a volume.

14. The system of claim 1, wherein the first receptacle assembly comprises a first plurality of contact beams extending from the first surface of the first receptacle assembly and a second plurality of contact beams extending from the second surface of the first receptacle assembly, and wherein the first and second pluralities of contact beams are conductively coupled to each other via the first and second surfaces of the first receptacle assembly.

15. The system of claim 14, wherein the second receptacle assembly comprises a first plurality of contact beams extending from the first surface of the second receptacle assembly and a second plurality of contact beams extending from the second surface of the second receptacle assembly, and wherein the first and second pluralities of contact beams of the second receptacle assembly are conductively coupled to each other via the first and second surfaces of the second receptacle assembly.

16. The system of claim 15, wherein the first and second pluralities of contact beams of the first receptacle assembly and the first and second pluralities of contact beams of the second receptacle assembly are conductively coupled to each other via the contact bridge.

17. A system comprising:
a first printed circuit board including a first electrical pad;
a first receptacle assembly connected to the first electrical pad, the first receptacle assembly comprising a first surface and a second surface, the first surface being displaced from the second surface so as to form a first space between the first surface and the second surface, the first receptacle assembly further comprising a contact beam attached to either the first surface or the second surface and extending toward the first space, the contact beam having an electrically-conductive connection with the first electrical pad;
a second printed circuit board including a second electrical pad;
a second receptacle assembly connected to the second electrical pad, the second receptacle assembly comprising a first surface and a second surface, the first surface being displaced from the second surface so as to form a second space between the first surface and the second surface, the second receptacle assembly further a contact beam attached to either the first surface or the second surface and extending towards the second space, the contact beam having an electrically-conductive connection with the second electrical pad; and
a contact bridge having a central portion, a first receptacle engagement portion extending from a first side of the central portion, and a second receptacle engagement portion extending from a second side of the central portion, wherein the first receptacle engagement portion is engaged with the contact beam of the first receptacle assembly, and wherein the second receptacle engagement portion is engaged with the contact beam of the second receptacle assembly;
wherein a surface of the first receptacle engagement portion of the contact bridge includes a first discontinuity, the first discontinuity being proximate to a portion of the contact beams of the first receptacle assembly so as to prevent the contact bridge from moving in a direction away from the first receptacle assembly upon engagement of the first receptacle engagement portion of the contact bridge with the first receptacle assembly.

18. The system of claim 17, wherein the first continuity comprises a retention bump on the surface of the first receptacle engagement portion of the contact bridge.

19. A system comprising:
a first printed circuit board including a first electrical pad;
a first receptacle assembly connected to the first electrical pad, the first receptacle assembly comprising a first surface and a second surface, the first surface being displaced from the second surface so as to form a first space between the first surface and the second surface, the first receptacle assembly further comprising a contact beam attached to either the first surface or the second surface and extending toward the first space, the contact beam having an electrically-conductive connection with the first electrical pad;
a second printed circuit board including a second electrical pad;
a second receptacle assembly connected to the second electrical pad, the second receptacle assembly comprising a first surface and a second surface, the first surface being displaced from the second surface so as to form a second space between the first surface and the second surface, the second receptacle assembly further a contact beam attached to either the first surface or the second surface and extending towards the second space, the contact beam having an electrically-conductive connection with the second electrical pad; and
a contact bridge having a central portion, a first receptacle engagement portion extending from a first side of the central portion, and a second receptacle engagement portion extending from a second side of the central portion, wherein the first receptacle engagement portion is engaged with the contact beam of the first receptacle assembly, and wherein the second receptacle engagement portion is engaged with the contact beam of the second receptacle assembly;
wherein the central portion of the contact bridge comprises an arching portion that substantially encloses a volume in a circumferential manner.

20. The system of claim 19, wherein the central portion of the contact bridge comprises a planar portion, and wherein the arching portion extends from the planar portion.

\* \* \* \* \*